(12) United States Patent
Lee et al.

(10) Patent No.: US 9,766,559 B2
(45) Date of Patent: Sep. 19, 2017

(54) EDGE-DOMINANT ALIGNMENT METHOD IN EXPOSURE SCANNER SYSTEM

(71) Applicant: Taiwan Semiconductor Manufacturing Co., Ltd, Hsin-Chu, Taiwan (TW)

(72) Inventors: Yung-Yao Lee, Zhubei (TW); Ying-Ying Wang, Hsinchu (TW); Yi-Ping Hsieh, Hsinchu (TW); Heng-Hsin Liu, New Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 506 days.

(21) Appl. No.: 14/066,949

(22) Filed: Oct. 30, 2013

(65) Prior Publication Data

US 2015/0116686 A1    Apr. 30, 2015

(51) Int. Cl.
*G03F 9/00*       (2006.01)

(52) U.S. Cl.
CPC .............. *G03F 9/7084* (2013.01); *G03F 9/70* (2013.01); *G03F 9/7007* (2013.01); *G03F 9/7046* (2013.01); *G03F 9/7088* (2013.01); *G03F 2009/005* (2013.01)

(58) Field of Classification Search
CPC ............................. G03F 9/7046; G03F 9/7088
See application file for complete search history.

(56) References Cited

U.S. PATENT DOCUMENTS

| | | | | |
|---|---|---|---|---|
| 5,448,333 A | * | 9/1995 | Iwamoto | G03F 7/70358 355/53 |
| 6,341,007 B1 | * | 1/2002 | Nishi | G03F 7/70216 355/53 |
| 2006/0033916 A1 | * | 2/2006 | Sugihara | G03F 9/7003 356/401 |

* cited by examiner

*Primary Examiner* — Michelle M Iacoletti
(74) *Attorney, Agent, or Firm* — McClure, Qualey & Rodack, LLP (57) ABSTRACT

An edge-dominant alignment method for use in an exposure scanner system is provided. The method includes the steps of: providing a wafer having a plurality of shot areas, wherein each shot area has a plurality of alignment marks; determining a first outer zone of the wafer, wherein the first outer zone includes a first portion of the shot areas along a first outer edge of the wafer; determining a scan path according to the shot areas of the first outer zone; and performing an aligning process to each shot area of the first outer zone according to the scan path and an alignment mark of each shot area of the first outer zone.

17 Claims, 6 Drawing Sheets

EDGE-DOMINANT ALIGNMENT METHOD IN EXPOSURE SCANNER SYSTEM

BACKGROUND

Over the last four decades, the density of integrated circuits has increased by a relation known as Moore's law. Stated simply, Moore's law says that the number of transistors on integrated circuits (ICs) doubles approximately every two years. Thus, as long as the semiconductor industry can continue to uphold this simple "law," ICs double in speed and power approximately every two years. In large part, this remarkable increase in the speed and power of ICs has ushered in the dawn of today's information age.

Unlike the laws of nature, which hold true regardless of mankind's activities, Moore's law only holds true only so long as innovators overcome the technological challenges associated with it. One of the advances that continues to allow Moore's law to hold true is optical overlay metrology, which allows extremely accurate overlay measurements to be performed between patterned layers. For example, optical overlay metrology can measure how accurately a first patterned layer aligns with respect to a second patterned layer above or below the first patterned layer. If a workpiece contains layers that are out of alignment, then the substrate can be reworked (e.g., a first or second layer which is a photoresist can be stripped) and returned to the photolithography process to be exposed again at a corrected alignment. Unfortunately, the tolerances or measurement uncertainties of these metrology techniques are too large for next-generation devices.

BRIEF DESCRIPTION OF THE DRAWINGS

The present disclosure can be more fully understood by reading the subsequent detailed description and examples with references made to the accompanying drawings, wherein.

DETAILED DESCRIPTION

Some variations of the embodiments are described. Throughout the various views and illustrative embodiments, like reference numbers are used to designate like elements.

During the semiconductor fabrication process, many exposure process steps require a wafer to be aligned in a certain orientation, such that overlap accuracy of the patterns of each layer on the wafer can be achieved. The wafer used in the exposure process is generally provided with alignment marks thereon to indicate reference orientation positions of the patterns of a certain layer on the wafer.

A wafer has a plurality of shot areas, wherein one shot area is defined by an exposure region on the wafer with a photo mask through an exposure process. Exposure equipment typically performs the exposure process by irradiating light on a photo-resist layer overlying the wafer. The exposure equipment includes an exposure head, an alignment mark sensor, an alignment stage and an exposure stage. In an embodiment for aligning a wafer, one alignment mark is disposed on some shot areas of the wafer. The alignment mark sensor detects the orientation positions of the alignment marks of the whole wafer at the alignment stage to obtain average compensation data for wafer alignment and the average compensation data for wafer alignment is conveyed to the exposure stage. Then, the photo resist layer of all shot areas on the wafer are exposed by the exposure head at the exposure stage according to the feedback of the average compensation data for wafer alignment to the exposure stage.

As the feature sizes of semiconductor devices have become smaller for new generation electronic products, design rule sets for semiconductor devices have shrunk. Accordingly, it is difficult to enlarge the process window for semiconductor devices, especially for wafer alignment accuracy in exposure equipment during an exposure process and, for the overlay accuracy of the patterns of each layer on the wafer. Compensation data for wafer alignment of the shot areas in one area of a wafer is different from compensation data for wafer alignment of the shot areas in another area of the wafer.

Figure 1:
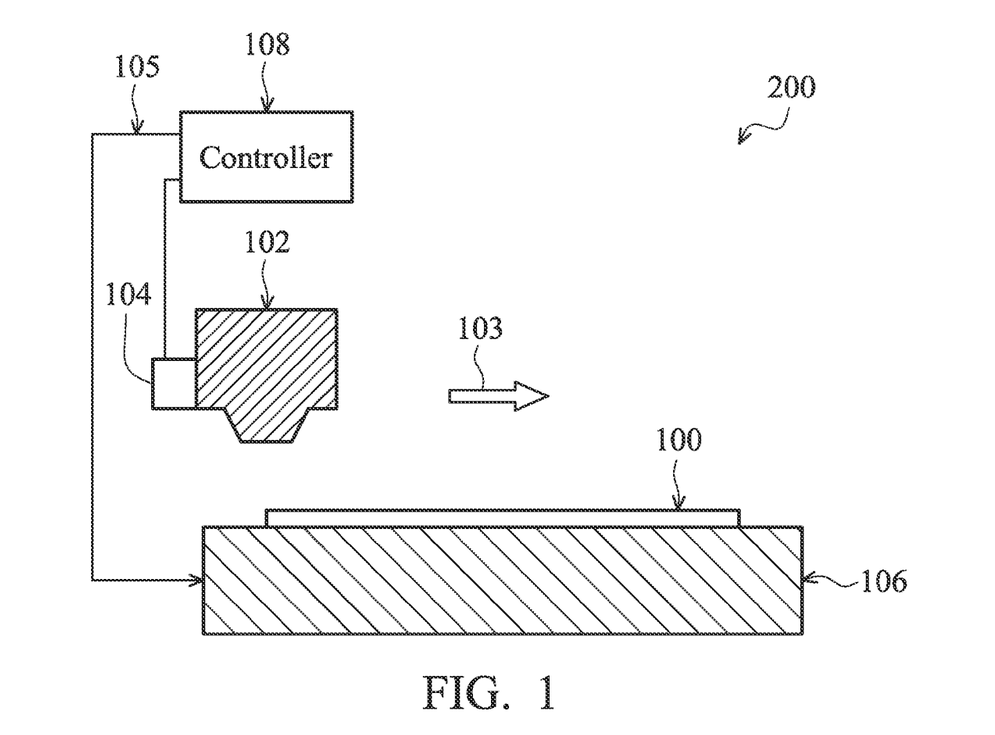
FIG. 1 is a schematic side view of an exposure scanner system 200 in accordance with some embodiments.

FIG. 1 is a schematic side view of an exposure scanner system 200 in accordance with some embodiments. The exposure scanner system 200 includes an exposure apparatus 102, an alignment apparatus 104, a single wafer stage 106 disposed under the exposure apparatus 102, and a controller 108. In some embodiment, the exposure apparatus 102 and the alignment apparatus 104 may have the same scan path 103. A wafer 100 having a photo-resist layer (not shown) formed thereon is provided on the wafer stage 106. The wafer 100 has a plurality of alignment marks (not shown) formed thereon. The alignment apparatus 104 are disposed according to the positions of alignment marks on the wafer 100 for detecting the orientation information of the alignment marks. The alignment apparatus 104 has a detection area which can cover the positions of alignment marks shifting from the position of the alignment mark sensors (not shown) of the alignment apparatus 104. In addition, the controller 108 is configured to process the orientation information of the alignment marks to obtain compensation data 105 for wafer alignment. Real time feedback of the compensation data 105 for wafer alignment to the wafer stage 106 is performed. The wafer stage 106 is typically provided with a wafer-moving mechanism which can bring and rotate the wafer 100 to a center position in both an X and Y direction and tilt the wafer 100 to a certain angle in a Z direction according to a signal of the compensation data 105 for wafer alignment conveyed from the alignment apparatus 104. It should be noted that the exposure scanner system 200 may comprise one or more alignment apparatus 104. In some embodiments, the alignment apparatus 104 may be disposed or attached on the exposure apparatus 102. Alternatively, the alignment apparatus 104 or the exposure apparatus 102 may be a stand-alone apparatus, respectively.

Figure 2:
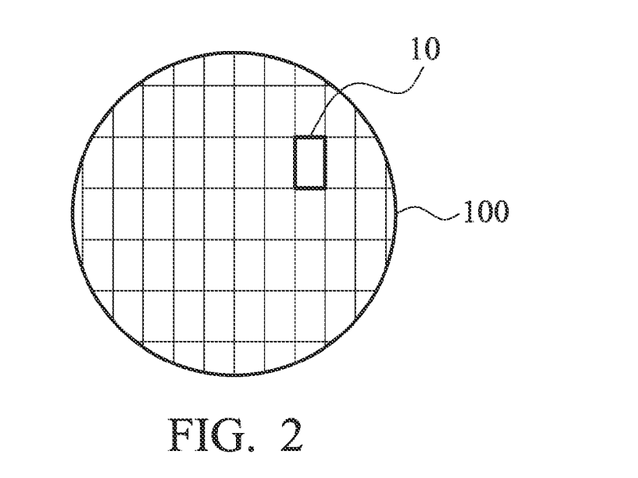
FIG. 2 shows a plane view of a wafer with a plurality of shot areas.

The exposure apparatus 102 generally comprises an ultraviolet (UV) light source to expose the photo-resist layer on the wafer 100 with a pattern of a photo mask. The exposure apparatus 102 continuously performs an exposure process on the photo-resist layer of one shot area along the scan path 103 after the wafer stage 106 receives the real time feedback of the compensation data 105 for wafer alignment and performs wafer alignment. Referring to FIG. 2, a plane view of the wafer 100 with a plurality of shot areas 10 is shown. One shot area 10 is defined by an exposure region on the wafer 100 exposed by a photo mask, and the photo mask generally comprises patterns for a plurality of chips. The photo-resist layer of one shot area is exposed with the photo mask by the exposure apparatus 102 along a scan path 103 until the photo-resist layer on the one shot area is completely exposed. Then, the photo-resist layer of the next shot area is exposed with the photo mask by the exposure apparatus 102 along another scan path opposite to the scan path 103 until the photoresist layer of all of the shot areas on the wafer 100 are exposed. The wafer 100 has shot areas 10 arranged by several columns and several rows as shown in FIG. 2.

Figure 3:
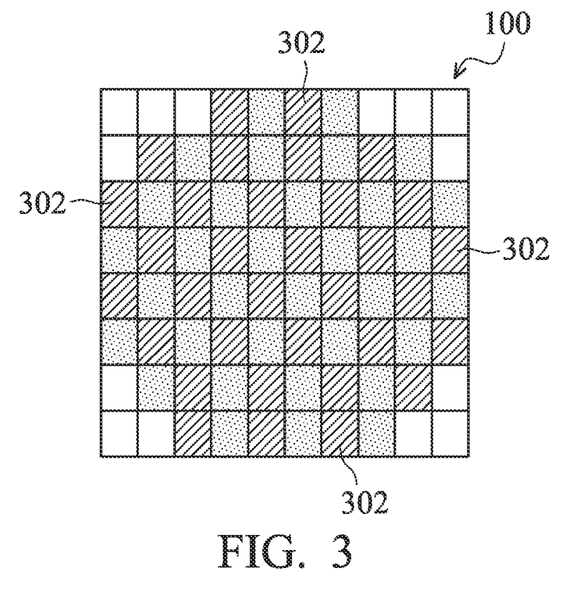
FIG. 3 is a diagram illustrating a uniform distribution of alignment marks in accordance with some embodiments.

FIG. 3 is a diagram illustrating a uniform distribution of alignment marks in accordance with some embodiments. Referring to FIG. 3, shot areas 302 (i.e. the black shot areas) with alignment marks, which are uniformly distributed on the wafer 100, have been predetermined in the exposure scanner system 200. Specifically, the exposure scanner system 200 may scan the shot areas 302 with alignment marks (e.g. an alignment field) before performing the exposure process on the wafer 100. Furthermore, the exposure scanner system 200 may directly perform the exposure process on the shot areas without the alignment marks.

Figure 4A:
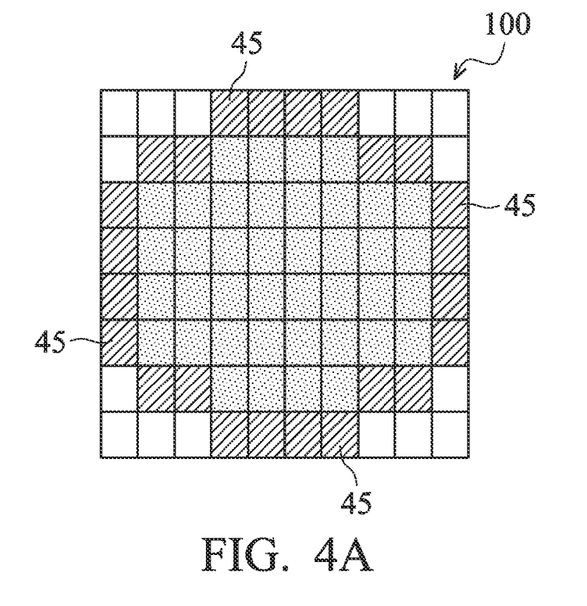
FIGS. 4A-4E are diagrams illustrating different distributions of alignment marks in accordance with some embodiments.
Figure 4B:
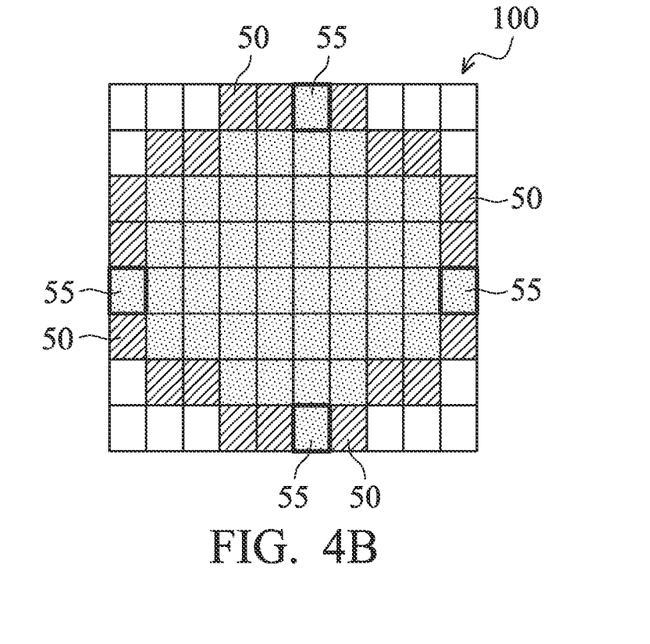

FIGS. 4A-4E are diagrams illustrating different distributions of alignment marks in accordance with some embodiments. In some embodiments, the wafer 100 is divided into shot areas, and each of the twenty-four shot areas 45 along the outer edge of the wafer 100 (i.e. edge shot areas) is marked with alignment marks (i.e. the shot areas with diagonal lines in FIG. 4A), as illustrated in FIG. 4A. In addition, a portion of the shot areas 45 of the wafer 100 (i.e. edge shot areas 50 (i.e. the shot areas with diagonal lines in FIG. 4B) are obtained by removing the shot areas 55 from the shot areas 45) can also be marked with alignment marks, as illustrated in FIG. 4B. It is noted that the shot areas along the edge of the wafer 100 are marked with the alignment marks, and the shot areas inside the edge of the wafer 100 are not marked with alignment marks. Specifically, the number of alignment marks may vary according to practical conditions such as manufacturing cost, time, overlay (OVL) accuracy, etc.

For example, the total number of edge shot areas of the wafer 100 is 32 in FIGS. 4A and 4B. Referring to FIG. 4A, when the number of alignment marks is equal to the number of edge shot areas, each of the edge shot areas is designated with an alignment mark, and the field formed by the edge shot areas 45 can be regarded as a "full edge field" or a first outer zone. When the number of alignment marks is less than the number of edge shot areas 45, it indicates that not all of the edge shot areas 45 can be designated with an alignment mark and the exposure scanner system 200 may determine the locations of the alignment marks. Afterwards, the exposure scanner system 200 may remove some symmetrically opposite paired edge areas from the shot areas in the full edge field. For example, referring to FIG. 4B, twenty edge shot areas 50 are marked with alignment marks. In other words, four edge shot areas 55 are removed from the edge shot areas 45 in the full edge field. In some embodiments, the locations of the edge shot areas 55 are symmetrically opposite, as illustrated in FIG. 4B. In some embodiments, the exposure scanner system 200 may determine the base location and angle $A_N$ of the alignment marks to be removed according to the following criterion:

$$A_N=360*(M/N), M=0,1,2,\ldots,N-1; \quad (1)$$

where $A_N$ denotes the angles (i.e. degrees) of the alignment marks to be removed (e.g. starting from 0 degree as the base location) from the full edge field, and N denotes the number of the alignment marks to be removed. Accordingly, when the alignment marks at the angles $A_N$ have been removed from the alignment marks in the full edge field, the exposure scanner system 200 obtains the remaining alignment marks, which is regarded as a "partial edge field", as illustrated in FIG. 4B. For example, referring to FIG. 4B, four alignment marks 55 are removed from the full edge field.

Figure 4C:
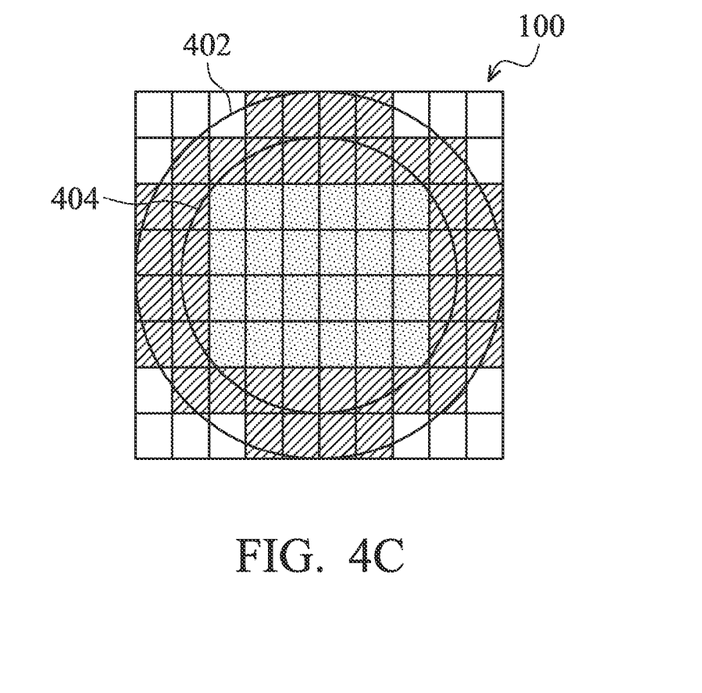

In some embodiments, some of the shot areas of the full edge field may be replaced with an alignment mark pair, which may be two horizontally adjacent shot areas having alignment marks or two vertically adjacent shot areas having alignment marks, as illustrated in FIG. 4C. Furthermore, the full edge field in FIG. 4C may be divided into a first outer zone and a second outer zone. Specifically, the first outer zone is an outer edge field along the most outer edge 402 of the wafer 100 and the second outer zone is an inner edge field along the inner edge 404 of the wafer 100. In addition, the number of shot areas having alignment marks in the first outer zone is greater than that in the second outer zone. In some embodiments, the full edge field in FIG. 4C may be divided into more than two zones, and the number of shot areas having alignment marks in an outer zone is larger than that in an inner zone.

Figure 4D:
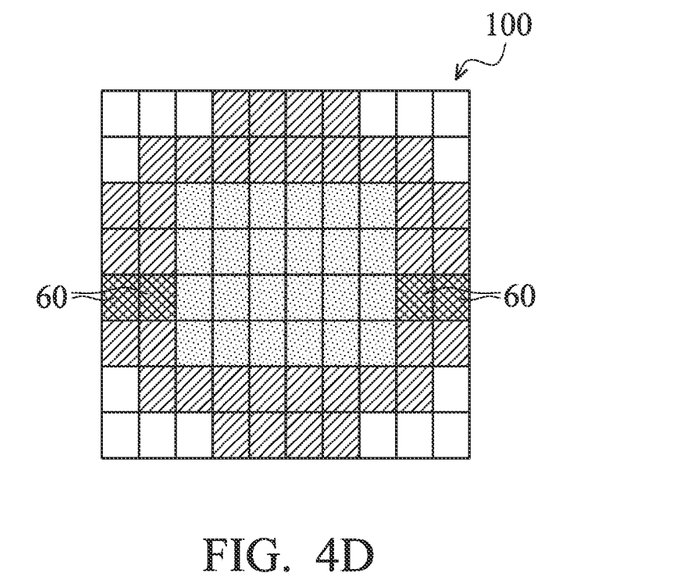

In some embodiment, referring to FIG. 4D, some shot areas 60 could be removed from the edge shot areas in FIG. 4C. It should be noted that the edge shot areas can be removed in pairs and the locations of the removed shot areas 60 are still symmetrically opposite. The determination of the locations of edge shot areas to be removed can be referred to in formula (1) as described above.

Figure 4E:
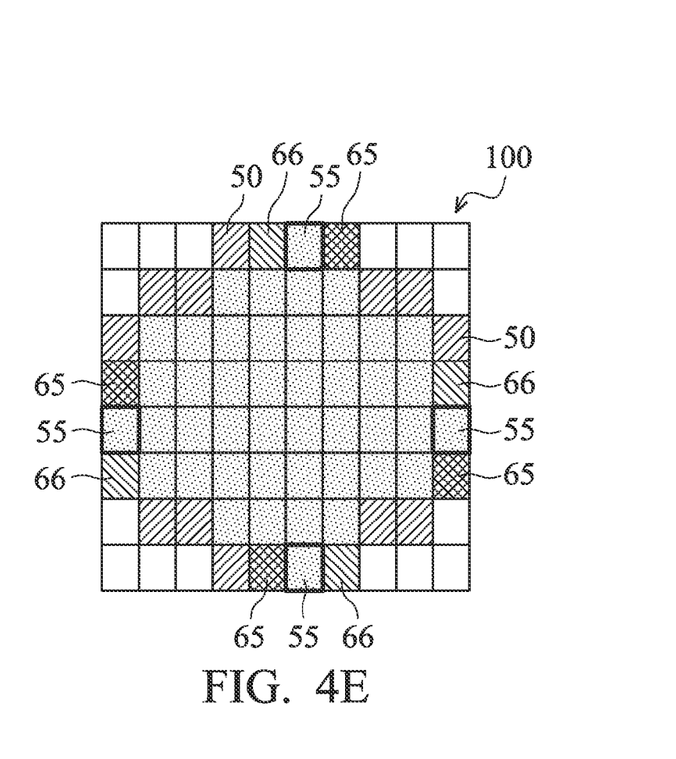

In some embodiments, referring to FIG. 4E, four edge shot areas 65 are removed from the edge shot areas 45 in the full edge field. However, compared with the edge shot areas 55 in FIG. 4B, the locations of the edge shot areas 65 in FIG. 4E may have some angle shift from the pre-determined symmetrical locations (e.g. based on formula (1)). Specifically, the predetermined symmetrical locations may be at 0, 90, 180, and 270 degrees (i.e. the locations of edge shot areas 55 in FIG. 4B). When the actual locations of the edge shot areas 65 are within a specific angle (e.g. 30 degrees clockwise or counter-clockwise) from the predetermined symmetrical locations, the edge shot areas 65 or 66 can also be removed from the full edge field (e.g. the edge shot areas 45 in FIG. 4A) to perform the alignment process.

It should be noted that the exposure scanner system 200 performs the aligning process according to the reference location of each spot area to be aligned. Specifically, the reference location of each spot area is based on the one of the corners (e.g. upper-left, upper-right, bottom-left, or bottom-right corner) of each spot area. Taking the upper-left corner as the reference location of each spot area as an example, when the reference location is located outside the wafer 100, the corresponding spot area is not considered an edge spot area of the edge field. When the reference location is located inside the wafer and along the wafer edge, the corresponding spot area is considered an edge spot area of the edge field.

In view of the above, some variations of the alignment method are provided. As the radius R of the wafer 100 increases, the number of spot areas increases accordingly. Accordingly, more spot areas should be aligned in a larger-sized wafer before performing the exposure process to ensure the OVL accuracy. However, due to time and cost issues, the number of spot areas to be aligned by the exposure scanner system 200 is often limited, and therefore the exposure scanner system should select shot areas having alignment marks to effectively ensure OVL accuracy. Specifically, the number of shot areas to be aligned is in proportion to $R^2$ when the uniform distribution shown in FIG. 3 is used. However, the number of spot areas to be aligned is in proportion to R when one of the distributions shown in FIGS. 4A-4C is used. Accordingly, it would be more beneficial to ensure OVL accuracy (i.e. reduce the alignment residual) by using one of the edge-dominant distributions shown in FIGS. 4A-4C to align shot areas having the alignment marks in a larger-sized wafer.

Figure 5:
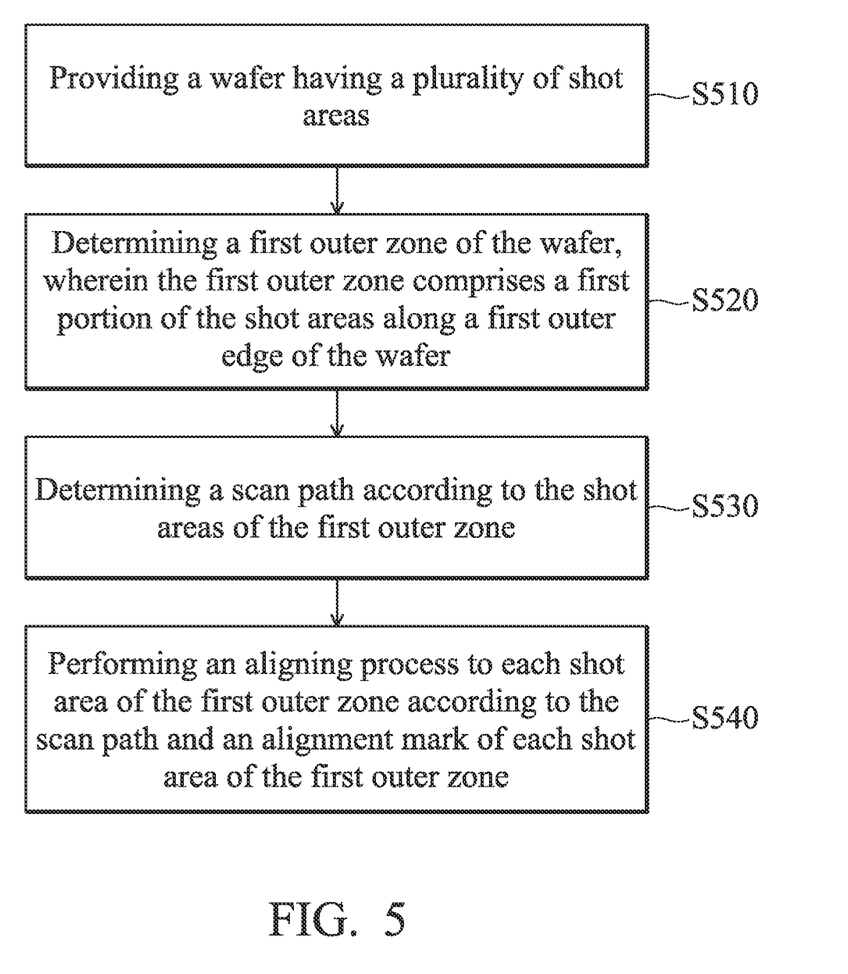
FIG. 5 is a flow chart illustrating an edge-dominant alignment method in the exposure scanner system in accordance with some embodiments.

FIG. 5 is a flow chart illustrating an edge-dominant alignment method in the exposure scanner system in accordance with some embodiments. In step S510, a wafer having shot areas is provided, and each shot area has alignment marks. In step S520, the controller 108 determines a first outer zone of the wafer 100, and the first outer zone includes a first portion of the shot areas along a first outer edge of the wafer 100. In step S530, the controller 108 determines a scan path according to the shot areas of the first outer zone. In step S540, the optical sensor apparatus 104 performs an aligning process to each shot area of the first outer zone according to the scan path and an alignment mark of each shot area of the first outer zone. It should be noted that the first outer zone may completely or partially include the shot areas along the outer edge of the wafer 100 (e.g. the full edge field and partial edge field as shown in FIGS. 4A and 4B, respectively). In addition, the exposure scanner system 200 may perform the aligning process on the scan path on which the shot areas along the outer edge of the wafer 100 before performing an exposure process. Regarding the shot areas which are not along the outer edge of the wafer 100, the exposure scanner system 200 may perform the exposure process directly without the aligning process.

Figure 6:
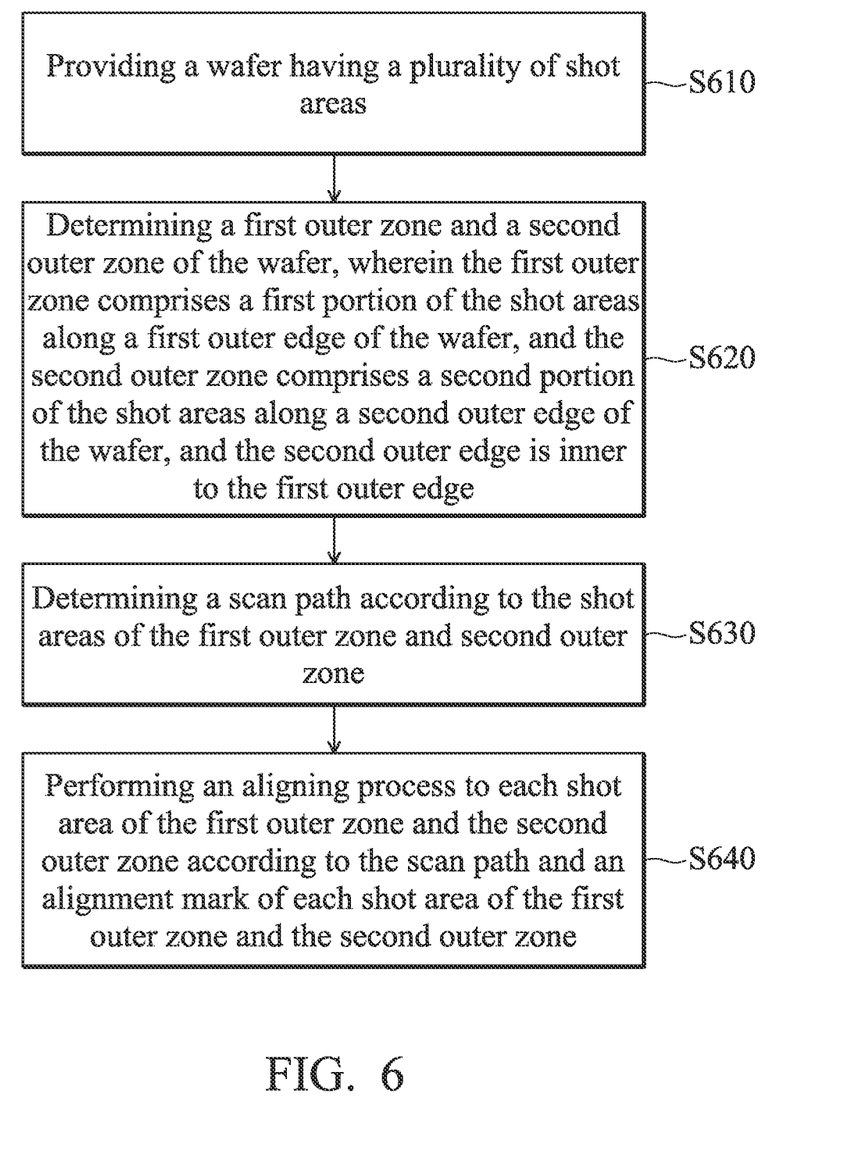
FIG. 6 is a flow chart illustrating an edge-dominant alignment method in the exposure scanner system in accordance with some other embodiments.

FIG. 6 is a flow chart illustrating an edge-dominant alignment method in the exposure scanner system in accordance with some other embodiments. In step S610, a wafer having shot areas is provided, and each shot area has alignment marks. In step S620, the controller 108 determines a first outer zone and a second outer zone of the wafer 100. The first outer zone includes a first portion of the shot areas along a first outer edge (e.g. edge 402 in FIG. 4C) of the wafer 100, and the second outer zone includes a second portion of the shot areas along a second outer edge (e.g. edge 404 in FIG. 4C) of the wafer 100, where the second outer edge is inner to the first outer edge. In step S630, the controller 108 determines a scan path according to the shot areas of the first outer zone and the second outer zone. In step S640, the optical sensor apparatus 104 performs an aligning process to each shot area of the first outer zone and the second outer zone according to the scan path and an alignment mark of each shot area of the first outer zone and the second outer zone. It should be noted that the first outer zone may completely or partially include the shot areas along the outer edge of the wafer 100 (e.g. the full edge field and partial edge field as shown in FIGS. 4A and 4B, respectively), and the second outer zone may be an edge field inner to the first outer zone. In addition, the exposure scanner system 200 may perform the aligning process on the scan path with the shot areas along the outer edge of the wafer 100 before performing an exposure process. Regarding the shot areas which are not along the outer edge of the wafer 100, the exposure scanner system 200 may perform the exposure process directly without the aligning process.

In view of the above, some variations of the exposure scanner system and the edge-dominant alignment method are provided. In some embodiments, an edge-dominant alignment method for use in an exposure scanner system is provided. The method includes the steps of: providing a wafer having a plurality of shot areas, wherein each shot area has a plurality of alignment marks; determining a first outer zone of the wafer, wherein the first outer zone comprises a first portion of the shot areas along a first outer edge of the wafer; determining a scan path according to the shot areas of the first outer zone; and performing an aligning process on each shot area of the first outer zone according to the scan path.

In some other embodiments, an exposure scanner system for wafer alignment is provided. The exposure scanner system includes: an exposure apparatus; an optical sensor apparatus, having a plurality of alignment mark sensors, disposed on the exposure apparatus; a wafer stage disposed under the exposure apparatus, wherein a wafer having a plurality of shot areas is placed on the wafer stage, and each shot area has a plurality of alignment marks; and a controller, configured to determine a first outer zone of the wafer, wherein the first outer zone includes a first portion of the shot areas along a first outer edge of the wafer, wherein the controller further determines a scan path according to the shot areas of the first outer zone, and the optical sensor apparatus further performs an aligning process on each shot area of the first outer zone according to the scan path and an alignment mark of each shot area of the first outer zone.

In some other embodiments, an edge-dominant alignment method for use in an exposure scanner system is provided. The edge-dominant method includes the steps of: providing a wafer having a plurality of shot areas, wherein each shot area has a plurality of alignment marks thereon; determining a first outer zone and a second outer zone of the wafer, wherein the first outer zone includes a first portion of the shot areas along a first outer edge of the wafer, and the second outer zone includes a second portion of the shot areas along a second outer edge of the wafer, and the second outer edge is inner to the first outer edge, wherein the number of the shot areas in the first portion is larger than the number of the shot areas in the third portion; determining a scan path according to the shot areas of the first outer zone and the second outer zone; and performing an aligning process on each shot area of the first outer zone and the second outer zone according to the scan path and an alignment mark of each shot area of the first outer zone and the second outer zone.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An edge-dominant alignment method for use in an exposure scanner system, comprising:
providing a wafer having a plurality of shot areas;
determining a first outer zone of the wafer, wherein the first outer zone comprises a first portion of the shot areas along a first outer edge of the wafer, wherein the first outer zone comprises pairs of shot areas along the first outer edge of the wafer, and each pair of shot areas comprise two shot areas adjacent to and in contact with each other;

determining a scan path according to the shot areas of the first outer zone, wherein each of the shot areas of the first outer zone has a respective alignment mark;

performing an aligning process to each shot area of the first outer zone using the respective alignment mark and exposing each shot area in the first outer zone both along the scan path; and exposing remaining ones of the shot areas other than the shot areas of the first outer zone along the scan path, wherein no aligning process is performed on the remaining ones of the shot areas prior to the step of exposing the remaining ones of the shot areas.

2. The edge-dominant alignment method as claimed in claim 1, wherein the first outer zone further comprises at least one single shot area along the first outer edge of the wafer, and the single shot area is a shot area without other shot areas adjacent thereto in a row direction or in a column direction within first outer zone.

3. The edge-dominant alignment method as claimed in claim 2, wherein the pairs of shot areas comprises pairs of two horizontally adjacent shot areas and pairs of two vertically adjacent shot areas.

4. The edge-dominant alignment method as claimed in claim 1, wherein the first outer zone comprises all the shot areas along the first outer edge of the wafer.

5. The edge-dominant alignment method as claimed in claim 1, further comprising:

determining a second portion of the shot areas along the first outer edge of the wafer;

removing the second portion of the shot areas from the shot areas along the first outer edge of the wafer to obtain the first portion of the shot areas, wherein the second portion of the shot areas is symmetrically opposite paired shot areas.

6. The edge-dominant alignment method as claimed in claim 1, further comprising:

determining a second portion of the shot areas along the first outer edge of the wafer;

removing the second portion of the shot areas from the shot areas along the first outer edge of the wafer to obtain the first portion of the shot areas, wherein the second portion of the shot areas is determined according to the following criterion:

$$A_N = 360*(M/N), M=0,1,2,\ldots,N-1;$$

where N is the number of the second portion of the shot areas, and $A_N$ is the location of each shot area in the second portion.

7. The edge-dominant alignment method as claimed in claim 1, further comprising:

determining a second outer zone of the wafer, wherein the second outer zone comprises a third portion of the shot areas along a second outer edge of the wafer, and the second outer edge is inner to the first outer edge.

8. The edge-dominant alignment method as claimed in claim 7, wherein the number of the shot areas in the first portion is larger than the number of the shot areas in the third portion.

9. An exposure scanner system for a wafer alignment, comprising:

an exposure apparatus;

an optical sensor apparatus, having a plurality of alignment mark sensors, disposed on the exposure apparatus;

a wafer stage disposed under the exposure apparatus, wherein a wafer having a plurality of shot areas is placed on the wafer stage; and a controller, configured to determine a first outer zone of the wafer, wherein the first outer zone comprises a first portion of the shot areas along a first outer edge of the wafer, wherein the first outer zone comprises pairs of shot areas, and each pair of shot areas comprise two shot areas adjacent to and in contact with each other, wherein each of the shot areas of the first outer zone has a respective alignment mark, wherein the controller is configured to further determine a scan path according to the shot areas of the first outer zone, wherein, using the respective alignment mark, the optical sensor apparatus is configured to perform an aligning process to each shot area of the first outer zone along the scan path, and the exposure apparatus is configured to expose each aligned shot area in the first outer zone and to expose remaining ones of the shot areas other than the shot areas of the first outer zone along the scan path identical to the aligning process, wherein no aligning process is performed on the remaining ones of the shot areas prior to exposing the remaining ones of the shot areas.

10. The exposure scanner system as claimed in claim 9, wherein the first outer zone further comprises at least one single shot area along the first outer edge of the wafer, and the single shot area is a shot area without other shot areas adjacent thereto in a row direction or in a column direction within first outer zone.

11. The exposure scanner system as claimed in claim 10, wherein the pairs of shot areas comprises pairs of two horizontally adjacent shot areas and pairs of two vertically adjacent shot areas.

12. The exposure scanner system as claimed in claim 9, wherein the first outer zone comprises all the shot areas along the first outer edge of the wafer.

13. The exposure scanner system as claimed in claim 9, wherein the controller is configured to further determine a second portion of the shot areas along the first outer edge of the wafer, and to remove the second portion of the shot areas from the shot area along the first outer edge of the wafer to obtain the first portion of the shot areas, wherein the second portion of the shot areas is symmetrically paired shot areas.

14. The exposure scanner system as claimed in claim 9, wherein the controller is configured to further determine a second portion of the shot areas along the first outer edge of the wafer, and to remove the second portion of the shot areas from the shot area along the first outer edge of the wafer to obtain the first portion of the shot areas, wherein the second portion of the shot areas is determined according to the following criterion:

$$A_N = 360*(M/N), M=0,1,2,\ldots,N-1;$$

where N is the number of the second portion of the shot areas, and $A_N$ is the location of each shot area in the second portion.

15. The exposure scanner system as claimed in claim 9, wherein the controller is configured to further determine a second outer zone of the wafer, wherein the second outer zone comprises a third portion of the shot areas along a second outer edge of the wafer, and the second outer edge is inner to the first outer edge.

16. The exposure scanner system as claimed in claim 15, wherein the number of the shot areas in the first portion is larger than the number of the shot areas in the third portion.

17. An edge-dominant alignment method for use in an exposure scanner system, comprising:
- providing a wafer having a plurality of shot areas;
- determining a first outer zone and a second outer zone of the wafer, wherein the first outer zone comprises a first portion of the shot areas along a first outer edge of the wafer, and the second outer zone comprises a second portion of the shot areas along a second outer edge of the wafer, and the second outer edge is inner to the first outer edge, wherein the number of the shot areas in the first portion is larger than the number of the shot areas in the second portion, wherein the shot areas of the first outer zone are adjacent to and contact the shot areas of the second outer zone;
- determining a scan path according to the shot areas of the first outer zone and second outer zone, wherein each of the shot areas of the first outer zone and the second outer zone has a respective alignment mark;
- performing an aligning process to each shot area of the first outer zone and the second outer zone using the respective alignment mark and exposing each shot area in the first outer zone and the second outer zone both along the scan path; and
- exposing remaining ones of the shot areas other than the shot areas of the first outer zone and the second outer zone along the scan path, wherein no aligning process is performed on the remaining ones of the shot areas prior to the step of exposing the remaining ones of the shot areas.

\* \* \* \* \*